March 31, 1970 A. F. CAKE 3,504,193

BIDIRECTIONAL COUNTERS HAVING POSITIVE TURN-ON AND TURN-OFF OF COUNTING DEVICES

Filed Dec. 21, 1966 2 Sheets-Sheet 1

INVENTOR.
ARTHUR F. CAKE

BY Robert G. Green

ATTORNEY

INVENTOR.
ARTHUR F. CAKE
BY Robert A. Green
ATTORNEY

United States Patent Office 3,504,193
Patented Mar. 31, 1970

3,504,193
BIDIRECTIONAL COUNTERS HAVING POSITIVE TURN-ON AND TURN-OFF OF COUNTING DEVICES

Arthur F. Cake, Orange, N.J., assignor to Burroughs Corporation, Detroit, Mich., a corporation of Michigan
Filed Dec. 21, 1966, Ser. No. 603,603
Int. Cl. H03k 21/00, 23/08
U.S. Cl. 307—222 14 Claims

ABSTRACT OF THE DISCLOSURE

An electronic counter including a plurality of semiconductor devices, each having a turn-on electrode and a turn-off electrode and having an input circuit coupled to all turn-on and turn-off electrodes. When an input pulse is applied, it positively turns off the device which was ON and positively turns on the next device in the series. The circuit operates in this way in either forward or reverse directions.

This invention relates to bidirectional electronic counting circuits which use multiple electrode semiconductor devices as the counting elements thereof.

Counting circuits using semiconductor devices such as triode transistors have been known for some time. A relatively new four-electrode semiconductor device known as a silicon controlled switch (SCS device) has also been used in counting circuits. SCS devices have the important characteristic known as memory; that is, after a device has been switched on by an input signal, it will remain on even though the input signal is removed. Although some counting circuits using SCS devices are known, none of these is reversible and none can operate at as high a counting speed as the circuits described below.

Briefly, a counting circuit embodying the invention includes a plurality of multiple electrode semiconductor devices coupled together in a counting chain and having coupling circuits between them which permit reversible operation at high speeds. The coupling circuits are such that an input counting pulse serves a dual function. The pulse both turns on a device in the chain to register a count and simultaneously positively turns off the device which had been on and which had registered the previous count. The coupling circuit and the driving arrangement are such that these operations are performed at high speed.

The invention is described in greater detail by reference to the drawing wherein.

Figure 1:
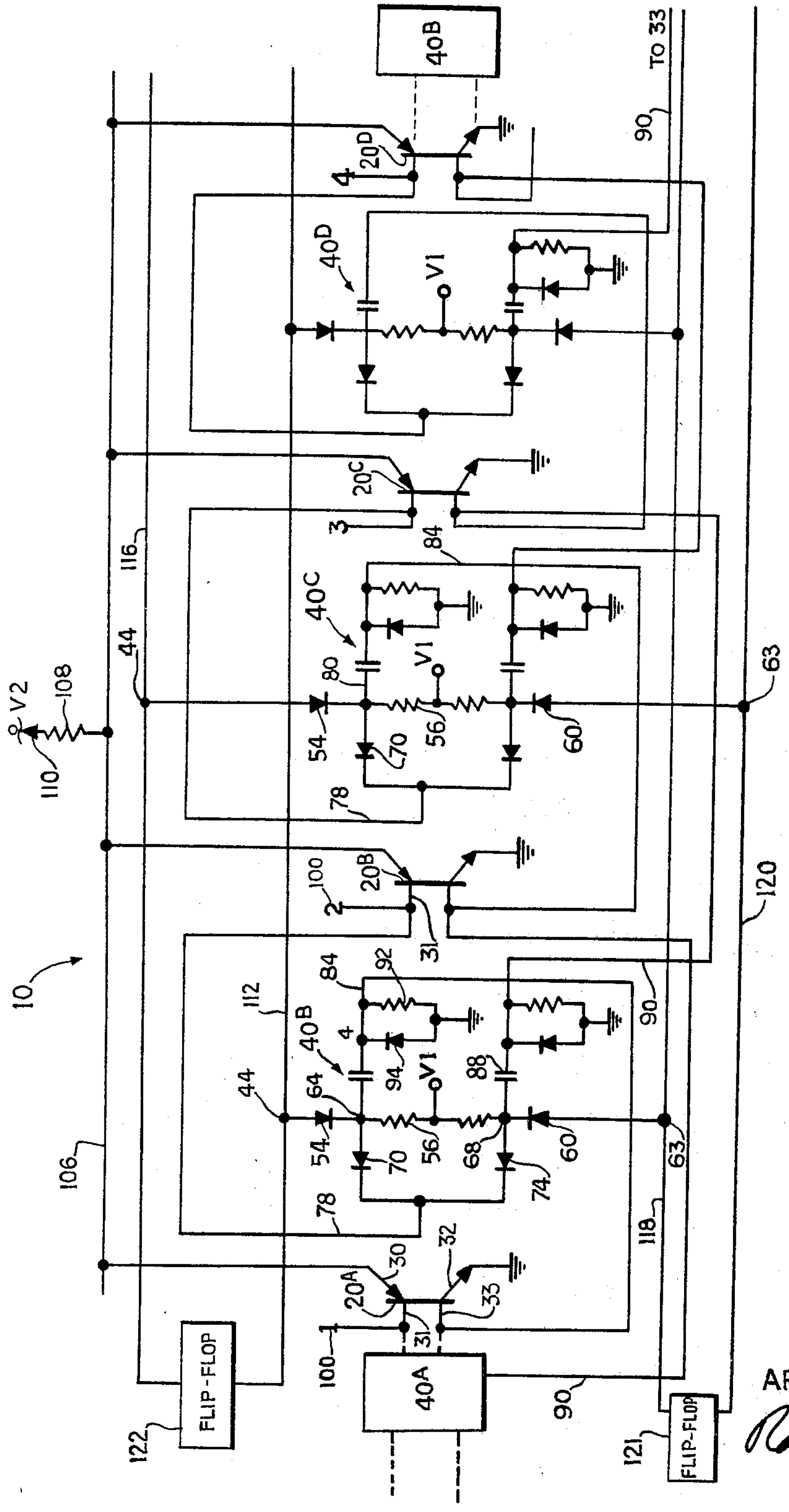
FIG. 1 is a schematic representation of a circuit embodying the invention.

Referring to FIG. 1, a reversible counting circuit 10 embodying the invention includes a chain of four-electrode semiconductor devices 20A, 20B, 20C, 20D . . . 20N which are used as count registering devices. These devices are known as silicon controlled switches (SCS devices), and each device includes four alternating zones of semiconductor material, each of which is used as a separate operating electrode. These zones or electrodes include an anode 30, an anode gate 31, a cathode 32, and a cathode gate 33. In each SCS device, a count pulse is applied to the cathode gate 33 to cause the device to register a count, and, for this reason, the cathode gate is called herein the count-causing electrode. Similarly, when a device is in the state of registering a count, a signal is applied to the anode gate to stop this operation. Thus, the anode gate is called herein, the count-stopping electrode.

In the circuit 10, the SCS devices 20 are coupled together by means of gating circuits 40A, 40B, 40C . . . 40N, some being shown in detail and some being shown as blocks.

Generally, a counting circuit such as circuit 10 is used as a decade counter and includes ten counting stages, each comprising a counting device 20 and a coupling circuit 40. However, in order to simplify the drawing, fewer than ten counting stages are shown.

The coupling circuits 40 are identical, and each includes a reverse count input terminal 44 which is coupled through a diode 54, a resistor path 56, and a second diode 60 to a forward count input terminal 63. The diode 54 has a junction 64 with the resistive path 56, and the diode 60 has a junction 68 therewith. A positive D.C. power source V1 is connected to resistive path 56.

In each coupling circuit 40, the junctions 64 and 68 are connected through separate diodes 70 and 74, respectively, and a common lead 78 to the anode gate electrode 31 of the associated SCS device 20. Thus, diodes 70 and 74 of coupling circuit 40B are coupled to the anode gate 31 of counting device 20B; these diodes of coupling circuit 40C are coupled to the anode gate of counting device 20C, etc.

In each coupling circuit, the junction 64 is coupled through a capacitor 80 and a lead 84 to the cathode gate electrode 33 of the adjacent preceding device 20 in the counting chain. Thus, the junction 64 in coupling circuit 40B is connected to the cathode gate 33 of SCS device 20A which precedes it in the counting chain, the junction 64 in coupling circuit 40C is connected to the cathode gate 33 of SCS device 20B, etc. These connections are for counting in the reverse direction. For counting in the forward direction, the junction 68 is coupled through a capacitor 88 and a lead 90 to the cathode gate electrode 33 of the adjacent SCS device in the leading direction. Thus, the junction 68 of coupling circuit 40A is connected through lead 90 to the cathode gate 33 of SCS device 20B which follows it in the counting chain, the junction 68 of coupling circuit 40B is connected to the cathode gate 33 of SCS device 20C, etc. The leads 84 and 90 in each coupling circuit are coupled to ground through a parallel-connected resistor 92 and diode 94.

The anode gate electrode 31 of each SCS device is also connected directly to the proper numeral glow cathode 100 of a type 6844A indicator tube to provide a visual display of the counting operation of the circuit 10. For simplicity, only the numeral cathodes of such a tube are shown, with the anode and envelope and other parts being omitted. The cathode electrodes 32 of the SCS devices are connected to ground potential, and the anode electrodes 30 are connected to bus 106 which is connected, in turn, through a common resistor 108 and a Zener diode 110 to a positive D.C. power supply V2.

In the counter circuit 10, the forward count input terminals 63 may be connected to a single source of counting pulses, and the reverse count input terminals 44 may be connected to a single source of counting pulses. However, in the preferred arrangement, the terminals 44 associated with even-numbered positions are connected to a common input bus 112, and the terminals 44 associated with odd-numbered positions are connected to a common bus 116, and input pulses are coupled to both buses in the proper sequence. The terminals 63 are similarly connected in groups to common buses 118 and 120 to which input pulses are applied as desired in the proper sequence. The input signals to each pair of buses may be applied by flip-flop circuits 121 and 122, each connected between a pair of buses.

Operation of circuit 10 as a counter is as follows. Assume that device 20B is on and has registered a count, and it is desired to count in the forward direction. To this end, a positive count pulse is applied to the bus 118 from source 121, and this pulse passes through diode 60, capacitor 88, and lead 90 to the cathode gate of SCS device 20C which is the next adjacent device in the leading direction. Since device 20B in ON, the associated junction point 68 (or 64) is at lower potential than the same points associated with the OFF devices. Thus, all of the diodes 60 (or 54) associated with the OFF devices are strongly reverse-biased due to voltage source V1, and only diode 60 (or 54) associated with device 20B is near forward bias. Thus, an input pulse can only forward bias and feed through diode 60 (or 54) associated with an ON device. Thus, the input pulse can only be applied to an ON device and to the adjacent OFF device. Device 20C had been off, and it is now turned on. At the same time, the first input pulse is also coupled through diode 74 and lead 78 to the anode gate 31 of SCS device 20B which had been on, but is now driven off. The next count pulse applied to bus 120 by the flip-flop operates in the same way to tur on device 20D and turn off device 20C. Thus, each positive input pulse turns off the device which is on and turns on the next adjacent leading device which had been off.

If it is desired to count in the reverse direction, the same positive count pulses are applied to the buses 112 and 116 by flip-flop 122. Assuming that device 20C is on, the first reverse pulse is applied to bus 116 and passes through diode 54 and capacitor 80 and lead 84 to the cathode gate of device 20B which is turned on. At the same time, this pulse passes through diode 70 and lead 78 to the anode gate of the "on" device 20C which is turned off. The next reverse pulse is applied to bus 112 and operates to turn on device 20A and turn off device 20B, and each successive pulse applied to the proper bus causes the count to progress by one device in the reverse direction.

In each coupling circuit, the power supply V1 is used to set the holding current of the associated SCS device, and the parallel resistor 92 and capacitor 94 remove to ground any negative charge present on capacitors 80 and 88.

Figure 2:
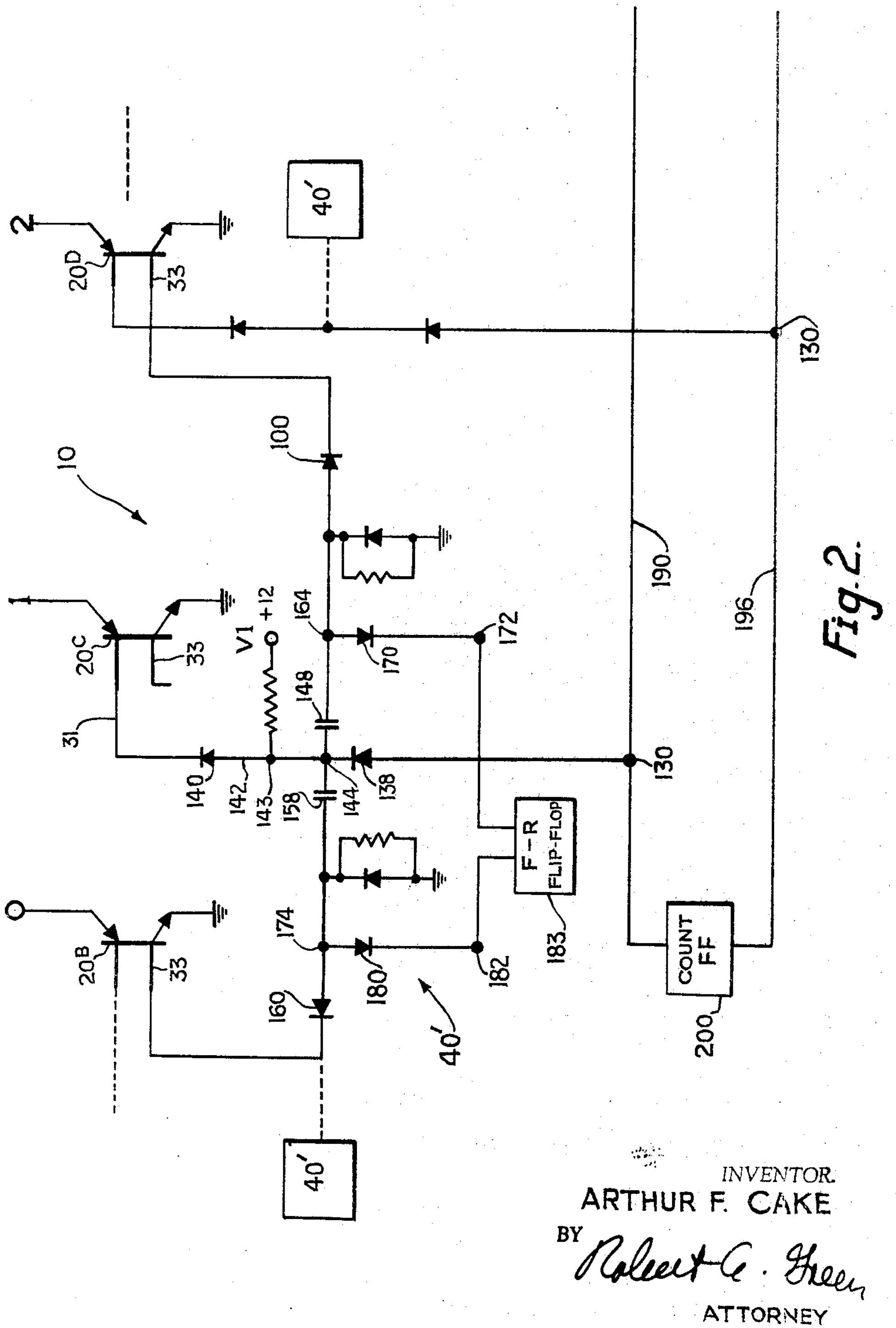
FIG. 2 is a schematic circuit representation of a modification of the invention.

A modification of the invention shown in FIG. 2 is adapted to operate with a single source of input pulses and with forward and reverse counting being controlled by auxiliary circuit means. Only new circuit elements and connections are shown and described. A counter 10', as shown in FIG. 2, includes a chain of SCS devices 20A, 20B, 20C, 20D . . . 20N, as above, with a modified coupling circuit 40' associated with each counting device. The coupling circuit 40' shown in FIG. 2 includes an input terminal 130 coupled through a pair of series-connected diodes 138 and 140 to the anode gate 31 of each SCS device. Power source V1 is suitably coupled to the lead 142 between the two diodes at point 143.

This lead 142, from point 144, is also connected through a capacitor 148 and a diode 150 to the cathode gate electrode 33 of the adjacent leading SCS device 20 and through a similar capacitor 158 and diode 160 to the cathode gate electrode 33 of the adjacent lagging SCS device 20. A point 164 between the capacitor 148 and diode 150 is connected through a diode 170 to a terminal 172 for applying forward count control potential to the coupling circuit, and a point 174 between the capacitor 158 and diode 160 is coupled through a diode 180 to a terminal 182 for applying reverse count control potential to the coupling circuit. The terminals 172 and 182 are each connected to one of the outputs of a conventional flip-flop 183 so that points 164 or 174 can be selectively grounded to control the direction of the counting operation. The parallel resistor 92 and diode 94 are provided as above to couple capacitors 148 and 158 to ground to remove negative charge.

In the circuit 10', the input count terminals 130 are connected in two groups, with the terminals at odd-numbered positions connected together to a bus 190 and the terminals at even-numbered positions being connected together to a bus 196. Each bus is connected to one of the outputs of a flip-flop circuit 200 for applying counting pulses thereto.

In operation of the circuit 10', assuming that the flip-flop 183 is set to ground point 174 and thus to block the reverse counting path and to open the forward counting path, and assuming that device 20C has registered a count and is on, then a counting pulse applied to input terminal 130 is coupled in the forward direction through diode 138, capacitor 148 and diode 150 to the cathode gate 33 of the adjacent leading SCS device 20D which is turned on. At the same time, the input counting pulse is coupled through diode 140 to the anode gate 31 of the "on" device 20C which is thus turned off. If the flip-flop is reversed so that point 164 is grounded and the circuit is set to count in the reverse direction, then the input pulse is coupled through capacitor 158 and diode 160 to the cathode gate of the adjacent lagging SCS device 20B which is turned on.

The circuits of the invention operate at considerably higher speeds than similar counter circuits using SCS devices in the prior art. The improvement in speed is of the order of two to five times, and this is due primarily to the fact that the SCS counting devices are positively driven on by pulses applied to cathode gates and are positively driven off by pulses applied to anode gates.

What is claimed is:

1. An electronic counting circuit module including:

a plurality of count-registering devices coupled in series and adapted to perform a count-registering operation, each device including first count-causing means for causing the device to register a count and second count-stopping means for ending the registration of a count, and separate circuit means associated with each device for controlling the application of counting pulses to said circuit module and for causing the counting operation to proceed from one device to the next in order, said separate circuit means including a first connection to said second count-stopping means of the device with which it is associated so that a count pulse can be applied positively thereto and so that a count-registering operation thereby can be discontinued, said circuit means including a second connection to said first count-causing means of the adjacent leading device so that a count pulse can be applied simultaneously positively thereto and the leading device can register a count.

2. The module defined in claim 1 wherein said count registering devices are four-electrode semiconductor switches, each of which includes an anode, an anode gate which comprises said second count-stopping means and by which a count-registering operation is discontinued, a cathode, and a cathode gate which comprises said first count-causing means by which a device registers a count, said anode and cathode being connected to reference potentials.

3. The circuit defined in claim 1 wherein said separate circuit means includes a third connection to said first count-causing means of the adjacent lagging device whereby input pulses may be applied thereto to cause the counting operation to proceed in the lagging direction.

4. The circuit defined in claim 1 wherein each separate circuit means includes: (1) a forward count input terminal coupled to said second count-stopping means for applying input count pulses thereto for counting in the forward direction, and (2) a reverse count input terminal coupled to said first count-causing means for applying input count pulses thereto for counting in the reverse direction.

5. The circuit defined in claim 1 wherein said devices and their associated separate circuit means occupy even-numbered and odd-numbered positions in said series and each separate circuit means includes an input terminal for applying input counting pulses thereto, the input terminals associated with devices at even-numbered positions being connected to a common input bus and the input terminals associated with devices at odd-numbered positions being connected to a common input bus.

6. The circuit defined in claim 5 and including a flip-flop input pulse source coupled between said common input buses.

7. The circuit defined in claim 1 wherein said devices and their associated separate circuit means occupy odd-numbered and even-numbered positions in said series and each separate circuit means includes: (1) a forward count input terminal coupled to said second connection for applying input count pulses thereto for counting in the forward direction, and (2) a reverse count input terminal coupled to said first connection for applying input count pulses thereto for counting in the reverse direction, said forward count input terminals being connected in an odd-numbered group and in an even-numbered group said reverse count input termials being connected in an odd-numbered group and in an even-numbered group a first flip-flop input pulse circuit connected between said groups of forward terminals, and a second flip-flop input pulse circuit connected between said groups of reverse terminals.

8. The circuit defined in claim 1 wherein:

each separate circuit means includes a forward count terminal which is connected through a first diode and a resistive path and a second diode to a reverse count terminal, said first diode having a first junction with said resistive path and said second diode having a second junction with said resistive path, a bias potential coupled to a point on said resistive path, said first and second junctions of said first and second diodes with said resistive path each being coupled through a diode to said second count-stopping electrode of the associated count-registering device whereby a device which is turned on and registering a count can be turned off, said first junction being also coupled to the first count-causing electrode of the discharge device adjacent to said associated device in the forward direction and said second junction being also coupled to the first count-causing electrode of the device adjacent to said associated device in the reverse direction so that when an input count pulse is applied to said circuit, it is coupled both to a count-registering device which is on and registering a count and to the adjacent device in the chain which is next to register a count.

9. An electronic counting circuit module including:

a plurality of count-registering devices coupled in series and adapted to perform a count-registering operation, each device including first count-causing means for causing the device to register a count and second count-stopping means for ending the registration of a count, separate circuit means associated with each device for controlling the application of counting pulses to said circuit module and for causing the counting operation to proceed from one device to the next in order, each said separate circuit means including an imput terminal for receiving input pulses coupled (1) through a first path to the second count-stopping means of the associated device, (2) through a second path to the count-causing means of the forward leading device, and (3) through a third path to the count-causing means of the reverse leading device, whereby input pulses can be applied positively to a device which is ON and positively to an adjacent device which is OFF and is to be turned ON, direction-control circuit means coupled to said second and third paths for selecting one or the other for the transmission of counting pulses therethrough.

10. The circuit defined in claim 9 wherein said direction-control circuit means comprises a flip-flop circuit having two outputs, one of which is coupled to said second path and the other of which is coupled to said third path.

11. The circuit defined in claim 9 wherein said devices and their associated separate circuit means occupy even-numbered and odd-numbered positions in said series and the input terminals are connected in groups with the input terminals associated with devices at even-numbered positions being connected to one common input bus and the input terminals associated with devices at odd-numbered positions being connected to a second common input bus.

12. The circuit defined in claim 11 and including a count-generating flip-flop circuit having two output leads, one of which is connected to said one common bus and the other of which is connected to said second common bus.

13. The circuit defined in claim 9 wherein said first path from said input terminal includes first and second similarly oriented diodes for applying an input pulse to a count-stopping means of a device, said second path includes a capacitor and diode in series, and said third path includes a capacitor and diode in series.

14. An electronic counting circuit module including:

a plurality of count-registering devices coupled in series and each adapted to perform a count-registering operation, each count-registering device having a turn-on electrode and a turn-off electrode, a source of input signals, and circuit means coupling the output of said source of input signals through a first path to the turn-on electrode of each device and through a second path to the turn-off electrode of each device whereby the same input signal can be transmitted through said first and second paths to positively turn on an OFF device and to positively turn off an ON device.

References Cited

UNITED STATES PATENTS

| | | | |
|---|---|---|---|
| 3,210,567 | 10/1965 | Wolfe | 307—222 |
| 3,304,436 | 2/1967 | Klinikowski | 307—222 |
| 3,317,751 | 5/1967 | Libby et al. | 307—222 |
| 3,329,834 | 7/1967 | Klinikowski | 307—221 X |
| 3,371,222 | 2/1968 | Guettler et al. | 307—222 |
| 3,389,270 | 6/1968 | Schoenfeld | 307—225 |

OTHER REFERENCES

Pub. I. "Sct. Shift Register," by J. B. Mackay in IBM Technical Disclosure Bulletin, vol 6, No. 1, dated June 1963, pp. 57 and 58.

JOHN S. HEYMAN, Primary Examiner

S. D. MILLER, Assistant Examiner

U.S. Cl. X.R.

307—225; 328—44